United States Patent
Yu et al.

(10) Patent No.: US 10,243,045 B2
(45) Date of Patent: Mar. 26, 2019

(54) SEMICONDUCTOR DEVICE

(71) Applicant: SAMSUNG ELECTRONICS CO., LTD., Suwon-si, Gyeonggi-do (KR)

(72) Inventors: Hyun Kwan Yu, Suwon-si (KR); Hyo Jin Kim, Hwaseong-si (KR); Ryong Ha, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/800,483

(22) Filed: Nov. 1, 2017

(65) Prior Publication Data

US 2018/0342583 A1  Nov. 29, 2018

(30) Foreign Application Priority Data

May 26, 2017  (KR) .......................... 10-2017-0065024

(51) Int. Cl.
| | |
|---|---|
| *H01L 29/08* | (2006.01) |
| *H01L 29/78* | (2006.01) |
| *H01L 27/092* | (2006.01) |
| *H01L 29/06* | (2006.01) |
| *H01L 21/762* | (2006.01) |

(52) U.S. Cl.
CPC .... *H01L 29/0847* (2013.01); *H01L 21/76224* (2013.01); *H01L 27/0924* (2013.01); *H01L 29/0653* (2013.01); *H01L 29/7854* (2013.01); *H01L 29/7848* (2013.01)

(58) Field of Classification Search
CPC ....... H01L 29/78; H01L 29/08; H01L 29/084; H01L 29/0847; H01L 29/0653; H01L 29/7851; H01L 21/76224; H01L 27/0924
See application file for complete search history.

(56) References Cited

U.S. PATENT DOCUMENTS

| | | |
|---|---|---|
| 8,598,003 B2 | 12/2013 | Murtthy et al. |
| 9,054,194 B2 | 6/2015 | Tung et al. |
| 9,153,692 B2 | 10/2015 | Kim et al. |
| 9,214,556 B2 | 12/2015 | Wann et al. |
| 9,431,534 B2 | 8/2016 | Breil et al. |
| 9,443,980 B2 | 9/2016 | Jensen et al. |
| 9,570,567 B1 | 2/2017 | Chang et al. |
| 2015/0035023 A1* | 2/2015 | Kim ...................... H01L 29/785 257/288 |
| 2016/0013316 A1* | 1/2016 | Kuang ................ H01L 21/0243 257/190 |
| 2016/0027918 A1* | 1/2016 | Kim .................... H01L 29/7848 257/401 |
| 2016/0049511 A1* | 2/2016 | Kim .................... H01L 29/7848 257/401 |
| 2016/0155845 A1* | 6/2016 | Breil ..................... H01L 29/785 257/347 |
| 2016/0211379 A1* | 7/2016 | You ..................... H01L 29/7853 |
| 2016/0293598 A1* | 10/2016 | Kim ..................... H01L 27/0886 |

(Continued)

*Primary Examiner* — Fazli Erdem
(74) *Attorney, Agent, or Firm* — Lee & Morse P.C.

(57) ABSTRACT

A semiconductor device is provided. The semiconductor device includes a fin-type pattern formed on a substrate and including first and second sidewalls, which are defined by a trench, a field insulating film placed in contact with the first and second sidewalls and filling the trench, and an epitaxial pattern formed on the fin-type pattern and including a first epitaxial layer and a second epitaxial layer, which is formed on the first epitaxial layer.

16 Claims, 15 Drawing Sheets

(56) References Cited

U.S. PATENT DOCUMENTS

| | | | |
|---|---|---|---|
| 2016/0293750 A1* | 10/2016 | Kim | H01L 29/7848 |
| 2016/0315172 A1* | 10/2016 | Wu | H01L 29/0847 |
| 2016/0315193 A1* | 10/2016 | Kim | H01L 29/7848 |
| 2016/0365452 A1* | 12/2016 | Tung | H01L 29/7853 |
| 2017/0033104 A1 | 2/2017 | He et al. | |
| 2017/0243944 A1* | 8/2017 | Li | H01L 29/0649 |
| 2017/0352759 A1* | 12/2017 | Kim | H01L 29/165 |

* cited by examiner

SEMICONDUCTOR DEVICE

CROSS-REFERENCE TO RELATED APPLICATION

This application claims priority under 35 U.S.C. § 119 to Korean Patent Application No. 10-2017-0065024, filed on May 26, 2017, the disclosure of which is incorporated herein by reference in its entirety.

BACKGROUND

1. Technical Field

The present disclosure relates to a semiconductor device, and more particularly, to a semiconductor device including an epitaxial pattern.

2. Description of the Related Art

As a scaling technique for increasing the integration density of a semiconductor device, a multi-gate transistor has been suggested in which a fin-shape silicon body is formed on a substrate and gates are formed on the surface of the silicon body. The multi-gate transistor uses a three-dimensional (3D) channel and is thus easy to be scaled up or down. Also, the current control capability of the multi-gate transistor can be improved without the need to increase the gate length of the multi-gate transistor. Also, a short channel effect (SCE), which is a phenomenon in which the electric potential of a channel region is affected by a drain voltage, can be effectively suppressed.

SUMMARY

According to an exemplary embodiment, there is provided a semiconductor device, including a fin-type pattern formed on a substrate and including first and second sidewalls, which are defined by a trench, a field insulating film placed in contact with the first and second sidewalls and filling the trench, and an epitaxial pattern formed on the fin-type pattern and including a first epitaxial layer and a second epitaxial layer, which is formed on the first epitaxial layer, wherein the fin-type pattern has a fin central line, which is perpendicular to a bottom surface of the trench, the fin central line passes through a center of a fin boundary line connecting a first point at which a top surface of the field insulating film and the first sidewall meet and a second point at which a top surface of the field insulating film and the second sidewall meet, the second epitaxial layer includes first and second portions, which are disposed on opposite sides of the fin central line, and at a first height with respect to the bottom surface of the trench, a width of the first portion is different from a width of the second portion.

According to the aforementioned and other exemplary embodiments there is provided a semiconductor device, including a first fin-type pattern formed on a substrate and including first and second sidewalls, which are defined by a trench, a second fin-type pattern being a first distance apart from the first sidewall, a third fin-type pattern being a second distance apart from the second sidewall, the second distance being smaller than the first distance, a first field insulating film placed in contact with the first sidewall and filling a gap between the first and second fin-type patterns, a second field insulating film placed in contact with the second sidewall and filling a gap between the first and third fin-type patterns, and a first epitaxial pattern formed on the first fin-type pattern, wherein the first epitaxial pattern has a fin central line, which is perpendicular to a bottom surface of the trench, the fin central line passes through a center of a fin boundary line connecting a first point at which a top surface of the field insulating film and the first sidewall meet and a second point at which a top surface of the field insulating film and the second sidewall meet, and the first epitaxial pattern is asymmetrical with respect to the fin central line.

According to the aforementioned and other exemplary embodiments, there is provided a semiconductor device, including a fin-type pattern formed on a substrate and including first and second sidewalls, which are defined by a trench, a field insulating film placed in contact with the first and second sidewalls and filling the trench, and an epitaxial pattern formed on the fin-type pattern and including a first epitaxial layer, which includes a first concentration of a first material, and a second epitaxial layer, which is formed on the first epitaxial layer and includes a second concentration of the first material, the second concentration being different from the first concentration, wherein the fin-type pattern has a fin central line, which is perpendicular to a bottom surface of the trench, the fin central line passes through a center of a fin boundary line connecting a first point at which a top surface of the field insulating film and the first sidewall meet and a second point at which a top surface of the field insulating film and the second sidewall meet, and the second epitaxial layer is asymmetrical with respect to the fin central line.

BRIEF DESCRIPTION OF THE DRAWINGS

The above and other exemplary embodiments and features will become more apparent by describing in detail exemplary embodiments thereof with reference to the attached drawings, in which.

DETAILED DESCRIPTION

A semiconductor device according to some exemplary embodiments will hereinafter be described with reference to FIGS. 1 through 3.

Figure 1:
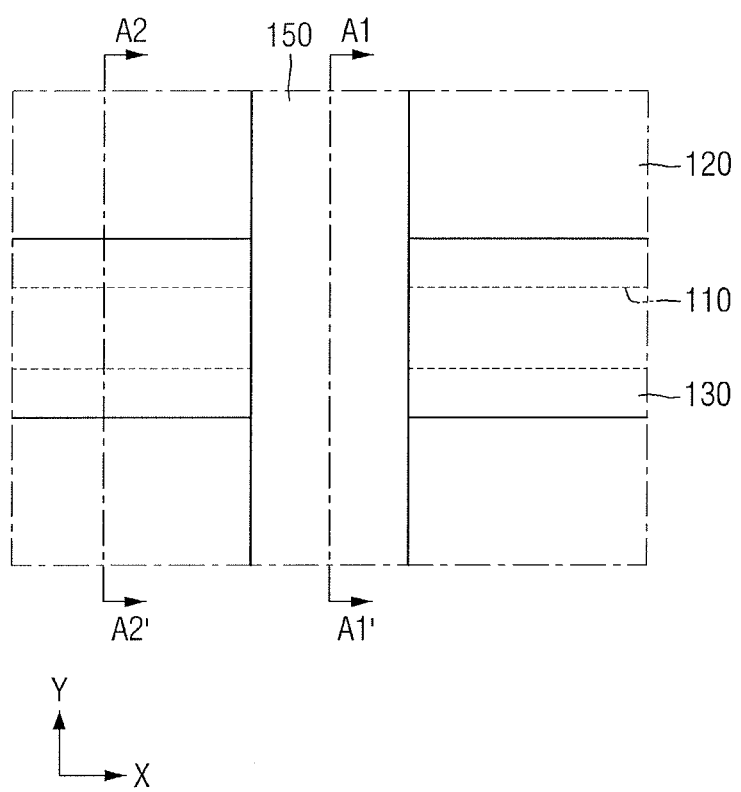
FIG. 1 is a plan view of a semiconductor device according to some exemplary embodiments.

FIG. 1 is a plan view of a semiconductor device according to some exemplary embodiments. FIG. 2 is a cross-sectional view taken along line A1-A1' of FIG. 1. FIG. 3 is a cross-sectional view taken along line A2-A2' of FIG. 1.

Figure 2:
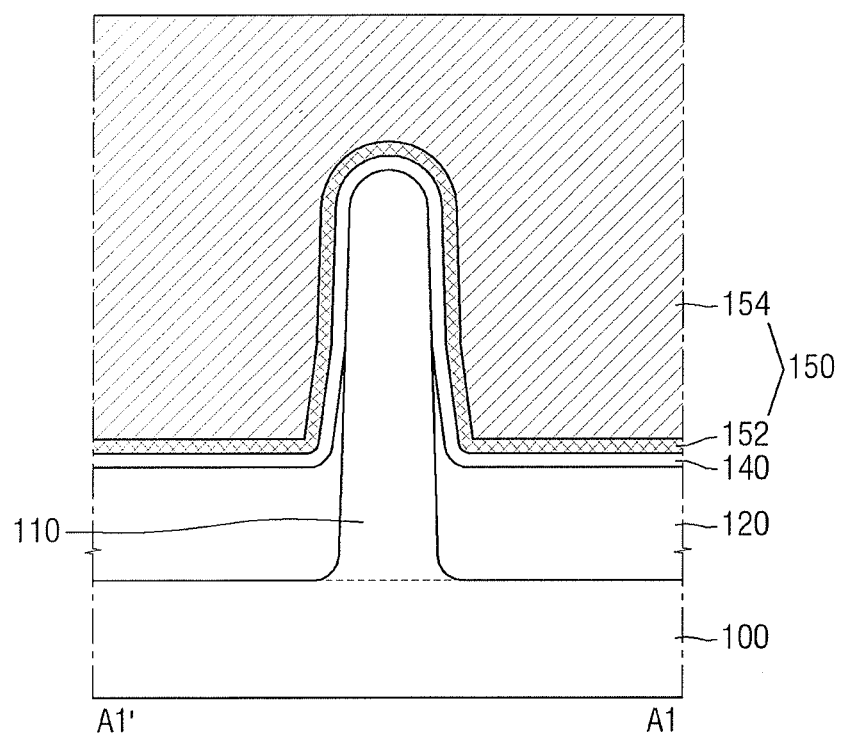
FIG. 2 is a cross-sectional view taken along line A1-A1' of FIG. 1.
Figure 3:
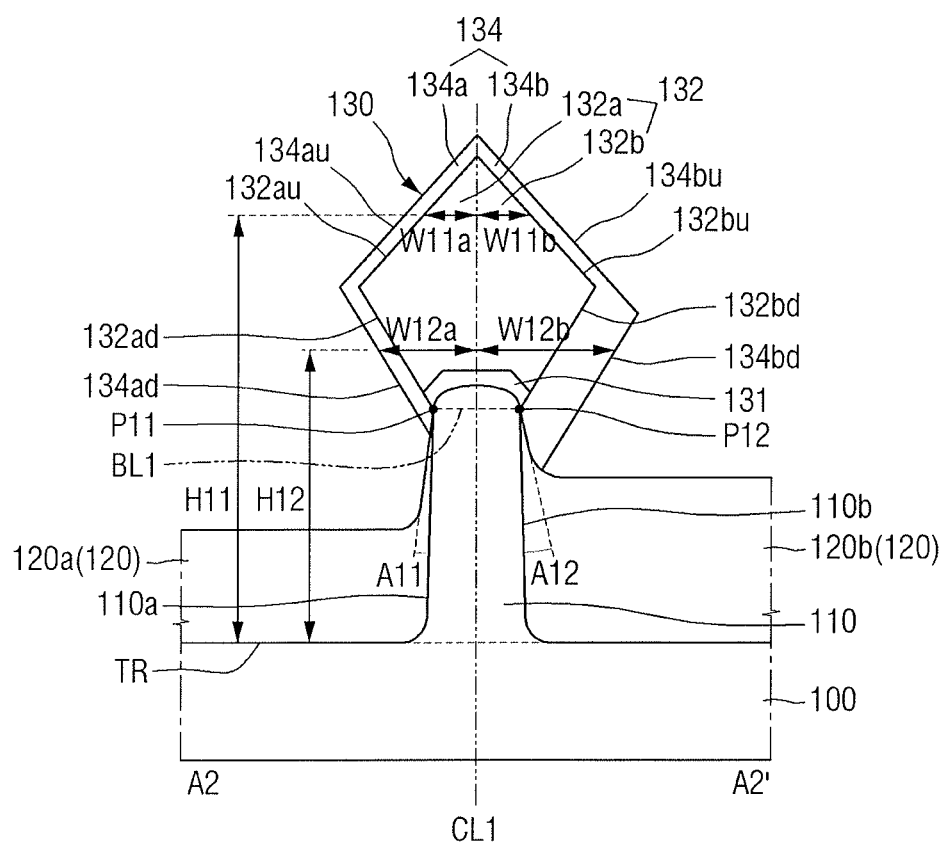
FIG. 3 is a cross-sectional view taken along line A2-A2' of FIG. 1.

Referring to FIGS. 1 through 3, the semiconductor device according to the exemplary embodiment of FIGS. 1 through 3 includes a substrate 100, a fin-type pattern 110, a field insulating film 120, a gate electrode 150, a gate insulating film 140, and an epitaxial pattern 130.

The substrate 100 may be, for example, a bulk silicon substrate or a silicon-on-insulator (SOI) substrate. Alternatively, the substrate 100 may be a silicon substrate or may include other materials such as, for example, silicon germanium, indium antimonide, a lead tellurium compound, indium arsenide, indium phosphide, gallium arsenide, or gallium antimonide. Alternatively, the substrate 100 may be a base substrate having an epitaxial layer formed thereon.

The fin-type pattern 110 may protrude from or be disposed on the substrate 100 and may extend along a first direction X. The fin-type pattern 110 may be defined by a trench TR on the substrate 100. In an embodiment, the fin-type pattern 110 may include first and second sidewalls 110a and 110b defined by the trench TR on the substrate 100. The first and second sidewalls 110a and 110b of the fin-type pattern 110 may extend along the first direction X.

The shape of the top surface of the fin-type pattern 110 may vary depending on the type of process. FIGS. 2 and 3 illustrate the fin-type pattern 110 as having a curved top surface, but the present disclosure is not limited thereto. That is, alternatively, the fin-type pattern 110 may have a flat top surface.

The fin-type pattern 110 may be a part of the substrate 100. The fin-type pattern 110 may include an epitaxial layer grown from the substrate 100. The fin-type pattern 110 may include an element semiconductor material such as, for example, silicon (Si) or germanium (Ge). Alternatively, the fin-type pattern 110 may include a compound semiconductor such as, for example, a group IV-IV compound semiconductor or a group III-V compound semiconductor.

In an embodiment, the fin-type pattern 110 may include a binary or ternary compound including at least two of carbon (C), Si, Ge, and tin (Sn), or a compound obtained by doping the binary or ternary compound with a group IV element. For example, the fin-type pattern 110 may include a binary, ternary, or quaternary compound obtained by combining at least one group III element such as aluminum (Al), gallium (Ga), and indium (In) with a group V element such as phosphorus (P), arsenic (As), and antimony (Sb). The fin-type pattern 110 will hereinafter be described as a Si fin-type pattern including Si.

The field insulating film 120 may cover the sides of the fin-type pattern 110 over the substrate 100. That is, the field insulating film 120 may fill the trench TR, which defines the first and second sidewalls 110a and 110b of the fin-type pattern 110. Accordingly, the field insulating film 120 may contact the first and second sidewalls 110a and 110b. A portion of the field insulating film 120 that is placed in contact with the first sidewall 110a is defined as a first field insulating film 120a, and a portion of the field insulating film 120 that is placed in contact with the second sidewall 110b is defined as a second field insulating film 120b.

At least part of the fin-type pattern 110 may protrude beyond the field insulating film 120. That is, as illustrated in FIGS. 2 and 3, at least part of the top surface of the fin-type pattern 110 may protrude beyond the top surfaces of the first and second field insulating films 120a and 120b.

Referring to FIG. 3, the point where the top surface of the first field insulating film 120a and the first sidewall 110a meet is defined as a first point P11, and the point where the top surface of the second field insulating film 120b and the second sidewall 110b meet is defined as a second point P12. The first and second points P11 and P12 are illustrated as having the same height with respect to the bottom surface of the trench TR, but the present disclosure is not limited thereto. That is, the first and second points P11 and P12 may have different heights. For example, the height of the first point P11 with respect to the bottom surface of the trench TR may be smaller than the height of the second point P12 with respect to the bottom surface of the trench TR.

The fin-type pattern 110 may have a fin boundary line BL1 and a fin central line CL1. The first and second points P11 and P12 may define the fin boundary line BL1 and the fin central line CL1 of the fin-type pattern 110.

Specifically, the fin boundary line BL1 may be defined as a straight line connecting the first and second points P11 and P12. At least part of the top surface of the fin-type pattern 110 may protrude beyond the first and second field insulating films 120a and 120b, and thus, the fin boundary line BL1 may divide the fin-type pattern 110.

The fin central line CL1 may be defined as a straight line passing through the center of the fin boundary line BL1 to be perpendicular to the bottom surface of the trench TR. When the first and second points P11 and P12 have the same height with respect to the bottom surface of the trench TR, the fin central line CL1 may be perpendicular to the fin boundary line BL1.

The top surface of the field insulating film 120 contacting the fin-type pattern 110 may have a slope with respect to the bottom surface of the trench TR. In an embodiment, at the first point P11, the first sidewall 110a and the top surface of the first field insulating film 120a may form a first angle A11. The first angle A11 may be an acute angle defined by the first sidewall 110a and the top surface of the first field insulating film 120a. At the second point P12, the second sidewall 110 and the top surface of the second field insulating film 120b may form a second angle A12. The second angle A12 may be an acute angle defined by the second sidewall 110b and the top surface of the second field insulating film 120b.

In some exemplary embodiments, the second angle A12 may be greater than the first angle A11. That is, the top surface of the second field insulating film 120b at the second point P12 has a gentler slope than the top surface of the first field insulating film 120a at the first point P11 with respect to the bottom surface of the trench TR.

The slope of the top surface of the field insulating film 120 may gradually become gentler away from the fin-type pattern 110. That is, the height of the top surface of the field insulating film 120 with respect to the bottom surface of the trench TR may gradually decrease away from the fin-type pattern 110. For example, the height of the top surface of the first field insulating film 120a gradually decreases away from the first point P11 and is then uniformly maintained. For example, the height of the top surface of the second field insulating film 120b gradually decreases away from the second point P12 and is then uniformly maintained.

In some exemplary embodiments, in a case where the second angle A12 is greater than the first angle A11, the uniformly-maintained height of the top surface of the first field insulating film 120*a* may be smaller than the uniformly-maintained height of the second field insulating film 120*b*.

The field insulating film 120 may include, for example, an oxide film, a nitride film, an oxynitride film, or a combination thereof, but the present disclosure is not limited thereto.

The gate electrode 150 may extend over the fin-type pattern 110 and the field insulating film 120 in a second direction Y, which intersects the first direction X. Accordingly, the gate electrode 150 may be formed to intersect the fin-type pattern 110.

The gate electrode 150 may include one or more metal layers. In an embodiment, the gate electrode 150 may include a stack of first and second metal layers 152 and 154. The first metal layer 152 may control a work function, and the second metal layer 154 may fill the space formed by the first metal layer 152.

The first metal layer 152 may include at least one of, for example, TiN, TaN, TiC, and TaC. The second metal layer 154 may include, for example, W or Al. The gate electrode 150 may be formed of silicon or silicon germanium, instead of a metal. The gate electrode 150 may be formed through, for example, a replacement process, but the present disclosure is not limited thereto.

The gate insulating film 140 may be interposed between the fin-type pattern 110 and the gate electrode 150. The gate insulating film 140 may be formed along the sidewalls and the top surface of the fin-type pattern 110 that protrude beyond the field insulating film 120. The gate insulating film 140 may be interposed between the gate electrode 150 and the field insulating film 120.

The gate insulating film 140 may include a high-k material having a higher dielectric constant than a silicon oxide film. For example, the high-k material may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but the present disclosure is not limited thereto.

The epitaxial pattern 130 may be formed on the fin-type pattern 110 on both sides of the gate electrode 150. The epitaxial pattern 130 may be insulated from the gate electrode 150. The epitaxial pattern 130 may serve as a source/drain of a transistor including the gate electrode 150.

In some exemplary embodiments, the epitaxial pattern 130 may be an elevated source/drain. That is, the uppermost portion of the epitaxial pattern 130 may protrude beyond the top surface of the fin-type pattern 110. In some exemplary embodiments, the epitaxial pattern 130 may be a source/drain shared in common between a plurality of gate electrodes.

The epitaxial pattern 130 may be formed as a multilayer. In an embodiment, the epitaxial pattern 130 may include a seed epitaxial layer 131, a first epitaxial layer 132, and a second epitaxial layer 134.

The seed epitaxial layer 131 may be formed on the fin-type pattern 110. For example, the seed epitaxial layer 131 may be formed from the fin-type pattern 110 by epitaxial growth. The seed epitaxial layer 131 may serve as a seed layer for forming the first and second epitaxial layers 132 and 134. However, in some exemplary embodiments, the seed epitaxial layer 131 may be omitted.

Referring to FIG. 3, when the fin-type pattern 110 has a curved top surface, the top of the seed epitaxial layer 131 may have inclined surfaces having a slope with respect to the bottom surface of the trench TR, but the present disclosure is not limited thereto. That is, when the fin-type pattern 110 has a flat top surface, the seed epitaxial layer 131 may also have a flat top surface.

The first epitaxial layer 132 may be formed on the seed epitaxial layer 131. For example, the first epitaxial layer 132 may be formed from the fin-type pattern 110 or the seed epitaxial layer 131 by epitaxial growth.

The first epitaxial layer 132 may include first and second portions 132*a* and 132*b*, which are disposed on opposite sides of the fin central line CL1. The exterior of the first epitaxial layer 132 may include a plurality of inclined surfaces. In an embodiment, an upper part of the first portion 132*a* may include a first upper inclined surface 132*au*, and a lower part of the first portion 132*a* may include a first lower inclined surface 132*ad*. In an embodiment, an upper part of the second portion 132*b* may include a second upper inclined surface 132*bu*, and a lower part of the second portion 132*b* may include a second lower inclined surface 132*bd*.

As the height of the first epitaxial layer 132 gradually decreases from the height of the uppermost portion of the first epitaxial layer 132, the distance between the first upper inclined surface 132*au* and the fin central line CL1 and the distance between the second upper inclined surface 132*bu* and the fin central line CL1 may gradually increase. As the height of the first epitaxial layer 132 gradually increases from the height of the lowermost portion of the first epitaxial layer 132, the distance between the first lower inclined surface 132*ad* and the fin central line CL1 and the distance between the second lower inclined surface 132*bd* may gradually increase.

In some exemplary embodiments, the first upper inclined surface 132*au* may be substantially parallel to the second lower inclined surface 132*bd*, and the first lower inclined surface 132*ad* may be substantially parallel to the second upper inclined surface 132*bu*. As a result, the outer circumferential surfaces of the first epitaxial layer 132 may form a diamond shape. For example, the first upper inclined surface 132*au*, the first lower inclined surface 132*ad*, the second upper inclined surface 132*bu*, and the second lower inclined surface 132*bd* may have a [111] crystal plane.

In some exemplary embodiments, the first epitaxial layer 132 may be symmetrical with respect to the fin central line CL1. In an embodiment, referring to FIG. 3, the width of the first portion 132*a* may be substantially the same as the width of the second portion 132*b*. The expression "two elements are substantially the same in a particular physical property", as used herein, not only means that the two elements are perfectly identical in the particular physical property, but also encompasses a case where the two elements are slightly different in the particular physical property due to, for example, process margins and the like.

In an embodiment, at an arbitrary first height H11, which is within the height range of the first epitaxial layer 132 with respect to the bottom surface of the trench TR, a first width W11*a* of the first portion 132*a* and a second width W11*b* of the second portion 132*b* may be substantially the same. The first width W11*a* may be defined as the distance between the outer side of the first portion 132*a* and the fin central line CL1 at the first height H11. The second width W11*b* may be defined as the distance between the outer side of the second portion 132*b* and the fin central line CL1 at the first height H11.

For example, at the first height H11, the distance between the fin central line CL1 and the first upper inclined surface 132*au* may be substantially the same as the distance between the fin central line CL1 and the second upper inclined surface 132*bu*. Since the first height H11 is the height of an arbitrary location on the first epitaxial layer 132, the area of the first portion 132*a* may be substantially the same as the area of the second portion 132*b*.

The second epitaxial layer 134 may be formed on the first epitaxial layer 132. For example, the second epitaxial layer 134 may be formed from the fin-type pattern 110, the seed epitaxial layer 131, or the first epitaxial layer 132 by epitaxial growth.

The second epitaxial layer 134 may include third and fourth portions 134*a* and 134*b*, which are disposed on opposite sides of the fin central line CL1. The exterior of the second epitaxial layer 134, like the exterior of the first epitaxial layer 132, may include a plurality of inclined surfaces. In an embodiment, an upper part of the third portion 134*a* may include a third upper inclined surface 134*au*, and a lower part of the third portion 134*a* may include a third lower inclined surface 134*ad*. An upper part of the fourth portion 134*b* may include a fourth upper inclined surface 134*bu*, and a lower part of the fourth portion 134*b* may include a fourth lower inclined surface 134*bd*.

As the height of the second epitaxial layer 134 gradually decreases from the height of the uppermost portion of the second epitaxial layer 134, the distance between the third upper inclined surface 134*au* and the fin central line CL1 and the distance between the fourth upper inclined surface 134*bu* and the fin central line CL1 may gradually increase. As the height of the second epitaxial layer 134 gradually increases from the height of the lowermost portion of the second epitaxial layer 134, the distance between the third lower inclined surface 134*ad* and the fin central line CL1 and the distance between the fourth lower inclined surface 134*bd* and the fin central line CL1 may gradually increase.

In some exemplary embodiments, the third upper inclined surface 134*au* may be substantially parallel to the fourth lower inclined surface 134*bd*, and the third lower inclined surface 134*ad* may be substantially parallel to the fourth upper inclined surface 134*bu*. As a result, the outer circumferential surfaces of the second epitaxial layer 134 may form a diamond shape. For example, the third upper inclined surface 134*au*, the third lower inclined surface 134*ad*, the fourth upper inclined surface 134*bu*, and the fourth lower inclined surface 134*bd* may have a [111] crystal plane.

In some exemplary embodiments, the second epitaxial layer 134 may be asymmetrical with respect to the fin central line CL1. In an embodiment, referring to FIG. 3, the width of the third portion 134*a* may be substantially the same as the width of the fourth portion 134*b*.

In an embodiment, at a particular second height H12, which is within the height range of the second epitaxial layer 134 with respect to the bottom surface of the trench TR, a third width W12*a* of the third portion 134*a* and a fourth width W12*b* of the fourth portion 134*b* may be different. The third width W12*a* may be defined as the distance between the fin central line CL1 and the outer side of the third portion 134*a* at the second height H12. The fourth width W12*b* may be defined as the distance between the fin central line CL1 and the outer side of the fourth portion 134*b* at the second height H12.

For example, at the second height H12, the distance between the fin central line CL1 and the third lower inclined surface 134*au* may be smaller than the distance between the fin central line CL1 and the fourth lower inclined surface 134*bu*. Referring to FIG. 3, the area of the third portion 134*a* may be different from the area of the fourth portion 134*b*.

In some exemplary embodiments, at the second height H12, the third width W12*a* may be substantially the same as the fourth width W12*b*. For example, at the second height 1412 where the third and fourth upper inclined surfaces 134*au* and 134*bu* are formed, the third width W12*a* and the fourth width W12*b* may be substantially the same.

In some exemplary embodiments, the second epitaxial layer 134 may direct contact the field insulating film 120. In an embodiment, the third portion 134*a* may be placed in direct contact with the first field insulating film 120*a*, and the fourth portion 134*b* may be placed in direct contact with the second field insulating film 120*b*. In this case, the area of contact between the third portion 134*a* and the first field insulating film 120*a* may be different from the area of contact between the fourth portion 134*b* and the second field insulating film 120*b*.

For example, the area of contact between the third portion 134*a* and the first field insulating film 120*a* may be smaller than the area of contact between the fourth portion 134*b* and the second field insulating film 120*b* because the first angle A11 is smaller than the second angle A12. Since the first angle A11 is smaller than the second angle A12, the top surface of the second field insulating film 120*b* at the second point P12 may have a gentler slope than the top surface of the first field insulating film 120*a* at the first point P11. Since the second epitaxial layer 134 may be grown along part of the top surface of the field insulating film 120 adjacent to the fin-type pattern 110, the fourth portion 134*b* may be grown along the top surface of the second field insulating film 120*b* with a gentle slope to become larger in size than the third portion 134*a*. Accordingly, the third width W12*a* may be smaller than the fourth width W12*b*.

In a case where the semiconductor device according to the exemplary embodiment of FIGS. 1 through 3 is a p-type metal oxide semiconductor (PMOS) transistor, the epitaxial pattern 130 may include p-type impurities or impurities for preventing the diffusion of p-type impurities. For example, the epitaxial pattern 130 may include at least one of B, C, In, Ga, Al, and a combination thereof.

When the semiconductor device according to the exemplary embodiment of FIGS. 1 through 3 is a PMOS transistor, the epitaxial pattern 130 may include a compressive stress material. For example, when the fin-type pattern 110 includes Si, the epitaxial pattern 130 may include a material having a larger lattice constant than Si, such as, for example, SiGe. The compressive stress material enhances the mobility of carriers in a channel region by applying compressive stress to the fin-type pattern 110.

In a case where the semiconductor device according to the exemplary embodiment of FIGS. 1 through 3 is an n-type metal oxide semiconductor (NMOS) transistor, the epitaxial pattern 130 may include n-type impurities or impurities for preventing the diffusion of n-type impurities. For example, the epitaxial pattern 130 may include at least one of P, Sb, As, and a combination thereof.

In a case where the semiconductor device according to the exemplary embodiment of FIGS. 1 through 3 is an NMOS transistor, the epitaxial pattern 130 may include a tensile stress material. For example, in a case where the fin-type pattern 110 includes Si, the epitaxial pattern 130 may include a material having a smaller lattice constant than Si, such as, for example, SiC. The tensile stress material enhances the mobility of carriers in the channel region by applying tensile stress to the fin-type pattern 110.

In some exemplary embodiments, the seed epitaxial layer 131, the first epitaxial layer 132, and the second epitaxial layer 134 may include various concentrations of a first material. For example, in a case where the semiconductor device according to the exemplary embodiment of FIGS. 1 through 3 is a PMOS transistor, the seed epitaxial layer 131 may include a first concentration of the first material, and the first material may be a compressive stress material. In a case where the seed epitaxial layer 131, the first epitaxial layer 132, and the second epitaxial layer 134 include Si, the first material may be, for example, Ge.

The first epitaxial layer 132 may include a second concentration of the first material, which is different from the first concentration, and the second epitaxial layer 134 may include a third concentration of the first material, which is different from the second concentration. The first and third concentrations may be about 10% to about 30%, and the second concentration may be about 40% to about 65%.

As the concentration of the first material increases, the compressive stress applied to the channel region increases. Accordingly, the first epitaxial layer 132 having the second concentration of the first material, which is higher than the first and third concentrations, may improve the mobility of carriers. Also, as the concentration of the first material increases, each of the seed epitaxial layer 131, the first epitaxial layer 132, and the second epitaxial layer 134 may become more easily etchable. Accordingly, the second epitaxial layer 134 having the third concentration of the first material, which is higher than the second concentration, may protect the first epitaxial layer 132 from an etching process.

In a case where the epitaxial pattern 130 is formed as a multilayer, the epitaxial pattern 130 may be formed into various shapes by controlling conditions for the growth of each of the seed epitaxial layer 131, the first epitaxial layer 132, and the second epitaxial layer 134.

For example, the epitaxial pattern 130 may be formed into various shapes by controlling the angle at which the field insulating film 120 is placed in contact with the fin-type pattern 110. For example, an epitaxial pattern 130 having a second epitaxial layer 134 in which the width of the third portion 134a is smaller than the width of the fourth portion 134b may be formed. That is, a second epitaxial layer 134 with an asymmetrical shape may be formed by controlling the angle at which the field insulating film 120 is placed in contact with the fin-type pattern 110.

Various shapes of epitaxial patterns may be needed depending on the type of process for fabricating a semiconductor device. For example, misalignment may often occur during the formation of a contact on an epitaxial pattern. The second epitaxial layer 134 with an asymmetric shape can prevent contact failure that may be caused by misalignment. Accordingly, the reliability of the semiconductor device according to the exemplary embodiment of FIGS. 1 through 3 can be improved.

Also, the second epitaxial layer 134, which is grown to have a relatively large size by controlling conditions for the growth of the second epitaxial layer 134, can reduce the electrical resistance with a contact. Accordingly, the operating characteristics of the semiconductor device according to the exemplary embodiment of FIGS. 1 through 3 can be improved.

Figure 4:
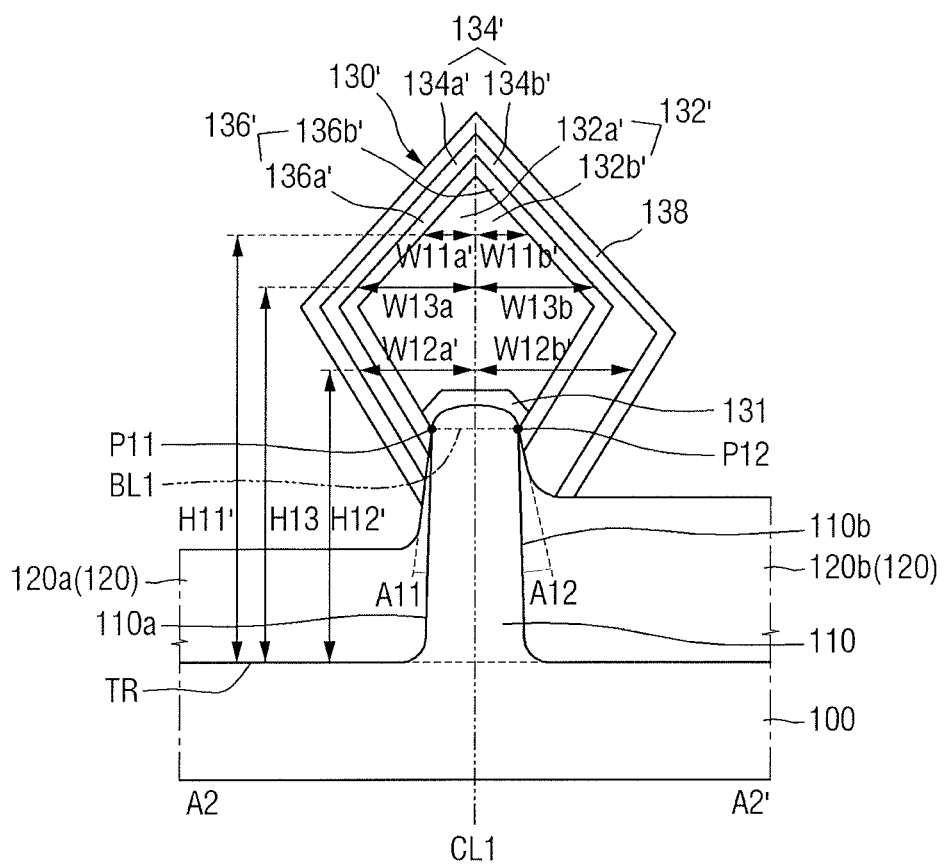
FIG. 4 is a cross-sectional view of a semiconductor device according to some exemplary embodiments.

FIG. 4 is a cross-sectional view of a semiconductor device according to some exemplary embodiments.

Referring to FIG. 4, the semiconductor device according to the exemplary embodiment of FIG. 4 includes an epitaxial pattern 130'. The epitaxial pattern 130' may include a first epitaxial layer 132', a second epitaxial layer 134', a third epitaxial layer 136', and a capping epitaxial layer 138.

The first epitaxial layer 132' may correspond to the first epitaxial layer 132 of FIG. 3. That is, the first epitaxial layer 132' may be symmetrical with respect to a fin central line CL1. In an embodiment, at an arbitrary first height H11', a first width W11a' of a first portion 132a' may be substantially the same as a second width W11b' of a second portion 132b'.

The second epitaxial layer 134' may correspond to the second epitaxial layer 134 of FIG. 3. That is, the second epitaxial layer 134' may be asymmetrical with respect to the fin central line CL1. Specifically, at a particular second height H12', a third width W12a' of a third portion 134a' may be different from a fourth width W12b' of a fourth portion 134b'.

The third epitaxial layer 136' may be interposed between the first and second epitaxial layers 132' and 134'. In some exemplary embodiments, the third epitaxial layer 136' may be symmetrical with respect to the fin central line CL1. Specifically, the third epitaxial layer 136' may include fifth and sixth portions 136a' and 136b', which are disposed on opposite sides of the fin central line CL1. At an arbitrary third height H13, a fifth width W13a of the fifth portion 136a' may be substantially the same as a sixth width W13b of the sixth portion 136b'.

However, the symmetricity of the third epitaxial layer 136' is not particularly limited. That is, alternatively, the third epitaxial layer 136' may be asymmetrical with respect to the fin central line CL1 depending on conditions for the growth of the third epitaxial layer 136'.

The capping epitaxial layer 138 may be formed on the second epitaxial layer 134'. The capping epitaxial layer 138 may be formed to cover the seed epitaxial layer 131, the first epitaxial layer 132', the second epitaxial layer 134', and the third epitaxial layer 136'. The capping epitaxial layer 138 may be formed to prevent the epitaxial pattern 130' from being excessively etched during the formation of a contact on the epitaxial pattern 130'.

In some exemplary embodiments, the first epitaxial layer 132', the second epitaxial layer 134', the third epitaxial layer 136', and the capping epitaxial layer 138 may include various concentrations of a first material. For example, in a case where the semiconductor device according to the exemplary embodiment of FIG. 4 is a PMOS transistor, the seed epitaxial layer 131 may include a first concentration of the first material, which is a compressive stress material.

The first epitaxial layer 132' may include a second concentration of the first material, which is different from the first concentration, and the third epitaxial layer 136' may include a third concentration of the first material, which is different from the second concentration. The second epitaxial layer 134' may include a fourth concentration of the first material, which is different from the third concentration, and the capping epitaxial layer 138 may include a fifth concentration of the first material, which is different from the fourth concentration. For example, the first and third concentrations may be about 10% to about 30%, and the second and fourth concentrations may be about 40% to about 65%. For example, the capping epitaxial layer 138 may not include the first material.

The first and second epitaxial layers 132' and 134' may improve the mobility of carriers. The third epitaxial layer 136' may protect the first epitaxial layer 132' from an etching process, and the capping epitaxial layer 138 may protect the second epitaxial layer 134' from an etching process.

Figure 5:
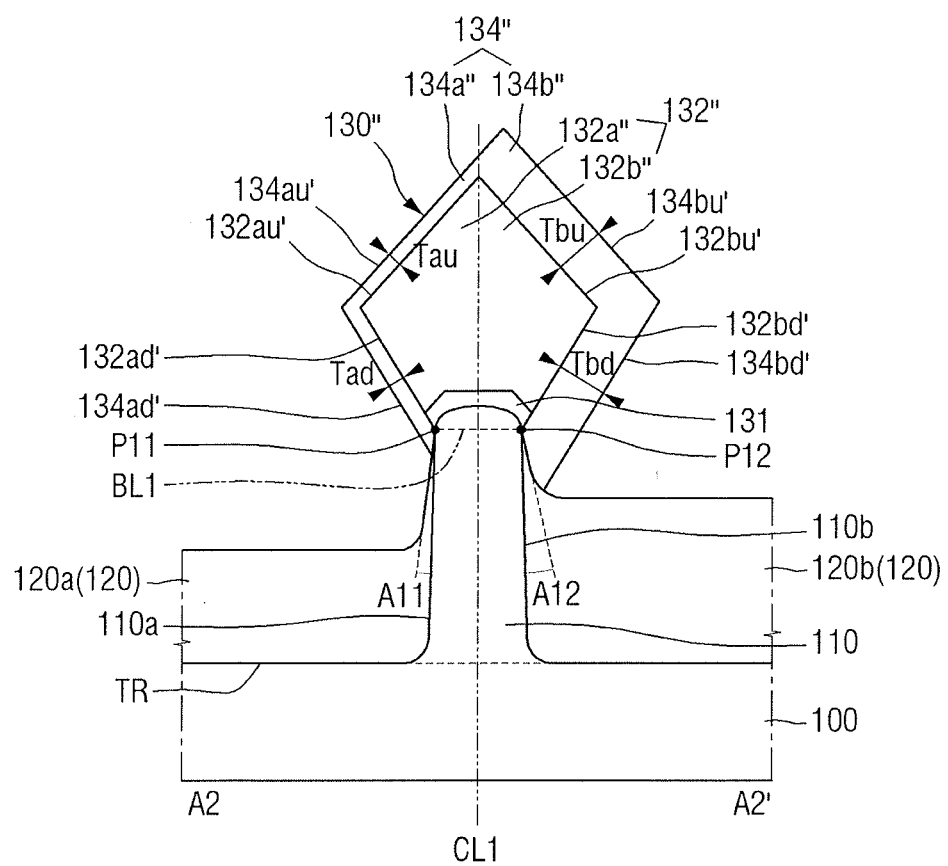
FIG. 5 is a cross-sectional view of a semiconductor device according to some exemplary embodiments.

FIG. 5 is a cross-sectional view of a semiconductor device according to some exemplary embodiments.

Referring to FIG. 5, the semiconductor device according to the exemplary embodiment of FIG. 5 includes an epitaxial pattern 130". The epitaxial pattern 130" may include a first epitaxial layer 132" and a second epitaxial layer 134".

The first epitaxial layer 132" may correspond to the first epitaxial layer 132 of FIG. 3. That is, the first epitaxial layer 132" may be symmetrical with respect to a fin central line CL1.

The second epitaxial layer 134" may correspond to the second epitaxial layer 134 of FIG. 3. That is, the second epitaxial layer 134" may be symmetrical with respect to the fin central line CL1.

The distance between first and third upper inclined surfaces 132au' and 134au' may be defined as a first thickness Tau, and the distance between second and fourth upper inclined surfaces 132bu' and 134bu' may be defined as a second thickness Tbu. The distance between first and third lower inclined surfaces 132ad' and 134ad' may be defined as a third thickness Tad, and the distance between second and fourth lower inclined surfaces 132bd' and 134bd' may be defined as a fourth thickness Tbd.

In some exemplary embodiments, the first thickness Tau may be smaller than the second thickness Tbu, and the third thickness Tad may be smaller than the fourth thickness Tbd. Also, in some exemplary embodiments, the first and third thicknesses Tau and Tad may be substantially the same, and the second and fourth thicknesses Tbu and Tbd may be substantially the same. Alternatively, the second and fourth thicknesses Tbu and Tbd may be different depending on conditions for the growth of the second epitaxial layer 134". For example, the second thickness Tbu may be greater than the fourth thickness Tbd.

Figure 6:
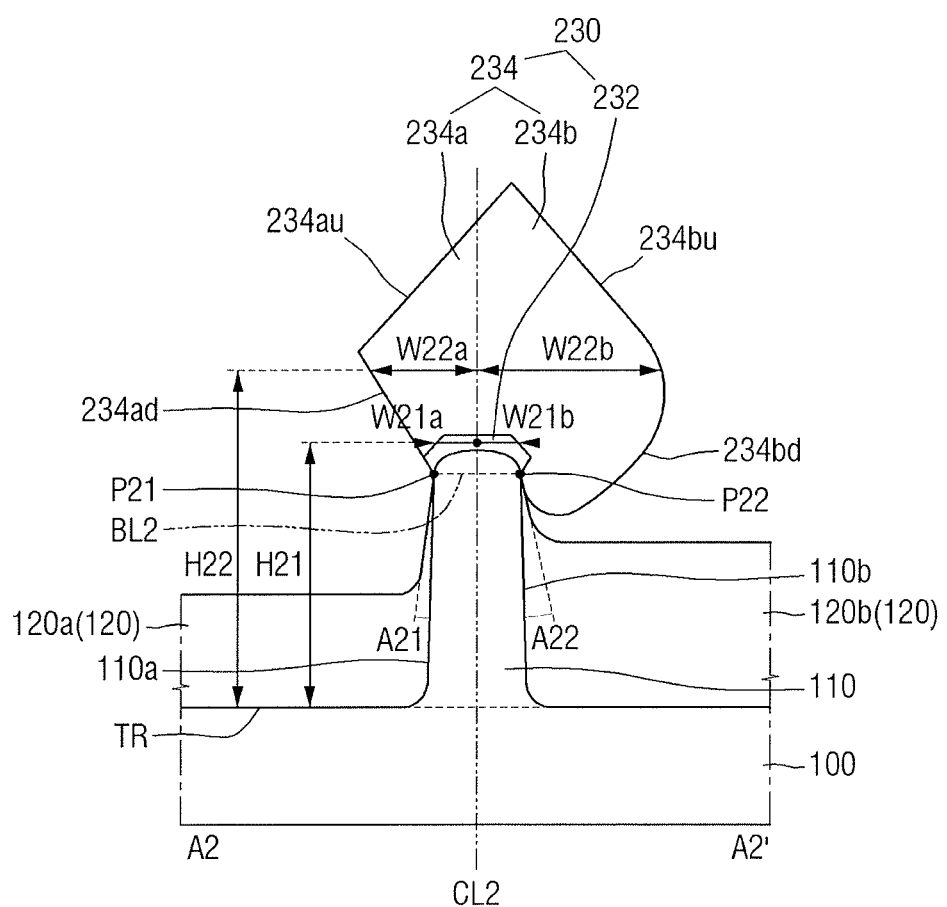
FIG. 6 is a cross-sectional view of a semiconductor device according to some exemplary embodiments.

FIG. 6 is a cross-sectional view of a semiconductor device according to some exemplary embodiments. For convenience, descriptions of elements that have already been described above with reference to FIGS. 1 through 3 will be omitted.

Referring to FIG. 6, the semiconductor device according to the exemplary embodiment of FIG. 6 includes an epitaxial pattern 230. The epitaxial pattern 230 may include a first epitaxial layer 232 and a second epitaxial layer 234.

The first epitaxial layer 232 may be formed on a fin-type pattern 110. The exterior of the first epitaxial layer 232 may have various shapes. For example, the first epitaxial layer 232 is illustrated in FIG. 6 as having a similar shape to the seed epitaxial layer 131. That is, the first epitaxial layer 232 may serve as a seed layer for forming the second epitaxial layer 234. However, the exterior shape of the first epitaxial layer 232 is not particularly limited. That is, the exterior of the first epitaxial layer 232 may have, for example, a diamond shape, a circular shape, or a rectangular shape.

The first epitaxial layer 232 may correspond to the first epitaxial layer 132 of FIG. 3. That is, the first epitaxial layer 232 may be symmetrical with respect to a fin central line CL2. Specifically, at an arbitrary first height H21, a first width W21a may be substantially the same as a second width W21b.

The second epitaxial layer 234 may correspond to the second epitaxial layer 134 of FIG. 3. That is, the second epitaxial layer 234 may be asymmetrical with respect to the fin central line CL2. Specifically, at a particular second height H22, a third width W22a of a third portion 234a may be different from a fourth width W22b of a fourth portion 234b.

In some exemplary embodiments, the exterior of the second epitaxial layer 234 may be at least partially rounded. For example, an upper part of the third portion 234a may include a first upper inclined surface 234au, and a lower part of the third portion 234a may include a first lower inclined surface 234ad. Also, an upper part of the fourth portion 234b may include a second upper inclined surface 234bu, and a lower part of the fourth portion 234b may include a first curved surface 234bd.

Figure 7:
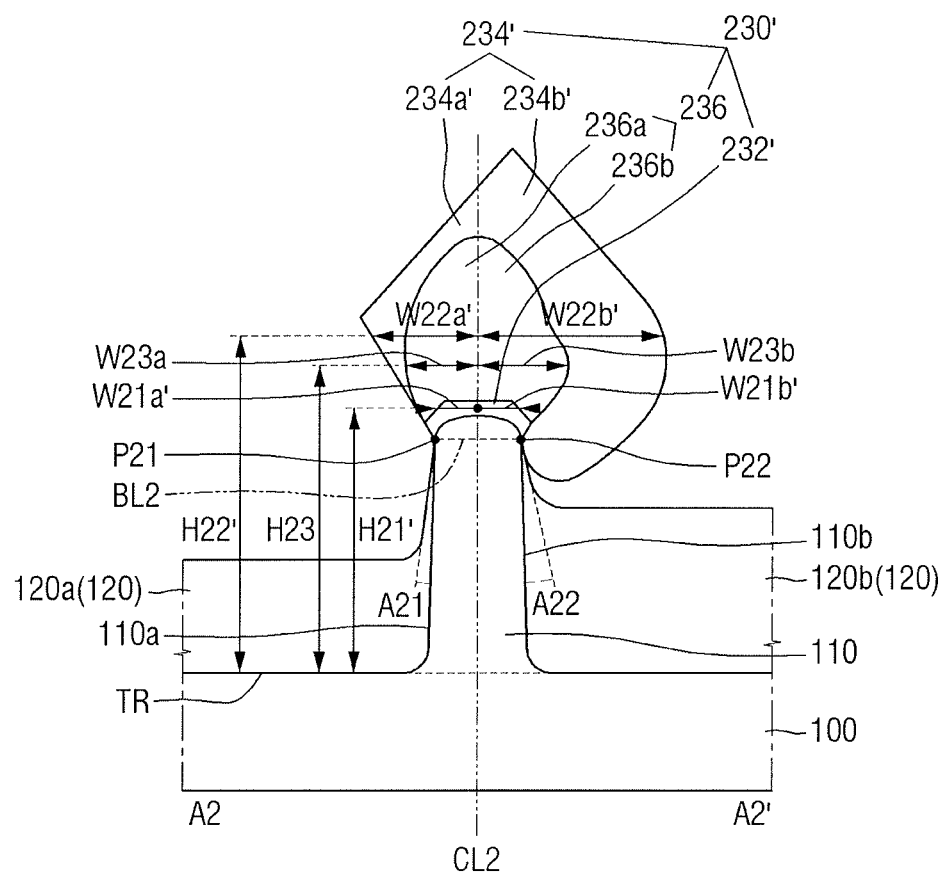
FIG. 7 is a cross-sectional view of a semiconductor device according to some exemplary embodiments.

FIG. 7 is a cross-sectional view of a semiconductor device according to some exemplary embodiments.

Referring to FIG. 7, the semiconductor device according to the exemplary embodiment of FIG. 7 includes an epitaxial pattern 230'. The epitaxial pattern 230' may include a first epitaxial layer 232', a second epitaxial layer 234', and a third epitaxial layer 236.

The first epitaxial layer 232' may correspond to the first epitaxial layer 232 of FIG. 6. That is, the first epitaxial layer 232' may be symmetrical with respect to a fin central line CL2. Specifically, at an arbitrary first height H21', a first width W21a' may be substantially the same as a second width W21b'.

The second epitaxial layer 234' may correspond to the second epitaxial layer 234 of FIG. 3. That is, the second epitaxial layer 234' may be asymmetrical with respect to the fin central line CL2. Specifically, at a particular second height H22', a third width W22a' of a third portion 234a' may be different from a fourth width W22b' of a fourth portion 234b'.

The third epitaxial layer 236 may be interposed between the first and second epitaxial layers 232' and 234'. The exterior of the third epitaxial layer 236 may be rounded as a whole. However, the exterior shape of the third epitaxial layer 236 is not particularly limited. That is, the exterior of the third epitaxial layer 236 may have, for example, a diamond shape, a circular shape, or a rectangular shape.

In some exemplary embodiments, the third epitaxial layer 236 may be asymmetrical with respect to the fin central line CL2. Specifically, the third epitaxial layer 236 may include fifth and sixth portions 236a and 236b, which are disposed on opposite sides of the fin central line CL2. At an arbitrary third height H23, a fifth width W23a of a fifth portion 236a may be substantially the same as a sixth width W23b of a sixth portion 236b.

However, the symmetricity of the third epitaxial layer 136' is not particularly limited. That is, alternatively, the third epitaxial layer 136' may be symmetrical with respect to the fin central line CL2 depending on conditions for the growth of the third epitaxial layer 136'.

Figure 8:
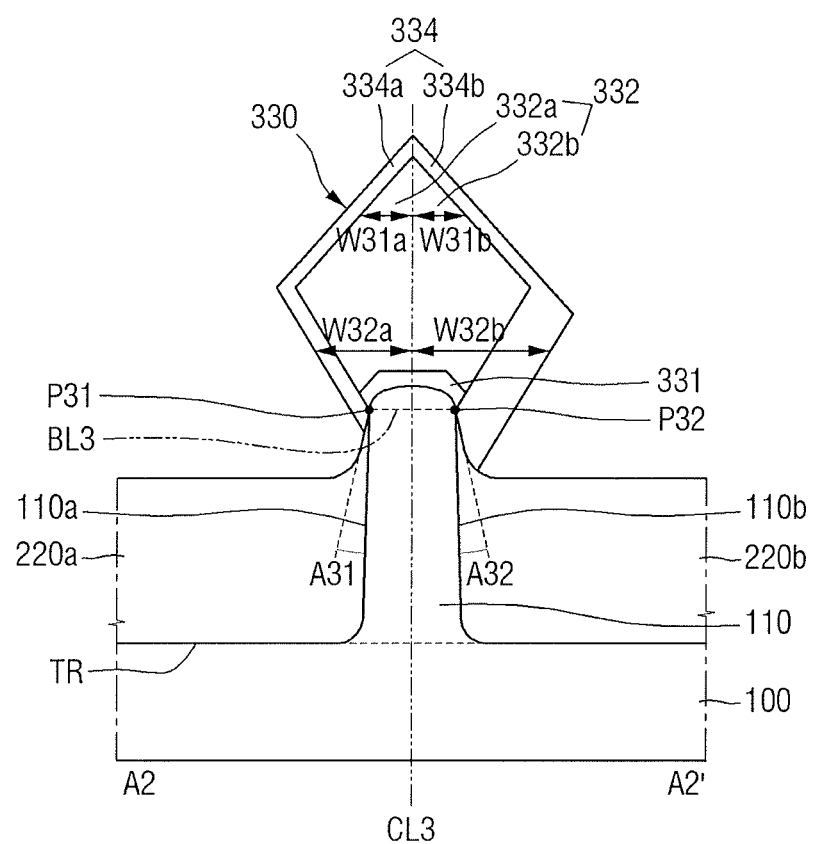
FIG. 8 is a cross-sectional view of a semiconductor device according to some exemplary embodiments.

FIG. 8 is a cross-sectional view of a semiconductor device according to some exemplary embodiments. For convenience, descriptions of elements that have already been described above with reference to FIGS. 1 through 3 will be omitted.

Referring to FIG. 8, the semiconductor device according to the exemplary embodiment of FIG. 8 includes a first field insulating film 220a, a second field insulating film 220b, and an epitaxial pattern 330. The epitaxial pattern 330 includes a first epitaxial layer 332 and a second epitaxial layer 334.

Referring to FIG. 8, the point where the top surface of the first field insulating film 220a and the first sidewall 110a meet is defined as a first point P31, and the point where the top surface of the second field insulating film 220b and the second sidewall 110b meet is defined as a second point P32.

At the first point P31, the first sidewall 110a and the top surface of the first field insulating film 220a may form a first angle A31. At the second point P32, the second sidewall 110b and the top surface of the second field insulating film 220b may form a second angle A32.

In some exemplary embodiments, the first angle A31 may be substantially the same as the second angle A32. That is, the top surface of the second field insulating film 220b at the second point P32 may have substantially the same slope as the top surface of the first field insulating film 220a at the first point P31 with respect to the bottom surface of a trench TR.

The first epitaxial layer 332 may correspond to the first epitaxial layer 132 of FIG. 3. That is, the first epitaxial layer 332 may be symmetrical with respect to a fin central line CL3. Specifically, a first width W31a of a first portion 332a may be substantially the same as a second width W31b of a second portion 332b.

The second epitaxial layer 334 may correspond to the second epitaxial layer 134 of FIG. 3. That is, the second epitaxial layer 334 may be asymmetrical with respect to the fin central line CL3. Specifically, a third width W32a of a third portion 334a may be substantially the same as a fourth width W32b of a fourth portion 334b.

The second epitaxial layer 334 may be asymmetrical depending on conditions for the growth of the second epitaxial layer 334. For example, the second epitaxial layer 334 may have an asymmetrical shape in accordance with conditions such as, for example, the growth temperature of the second epitaxial layer 334 and the amount of a source such as Ge.

Figure 9:
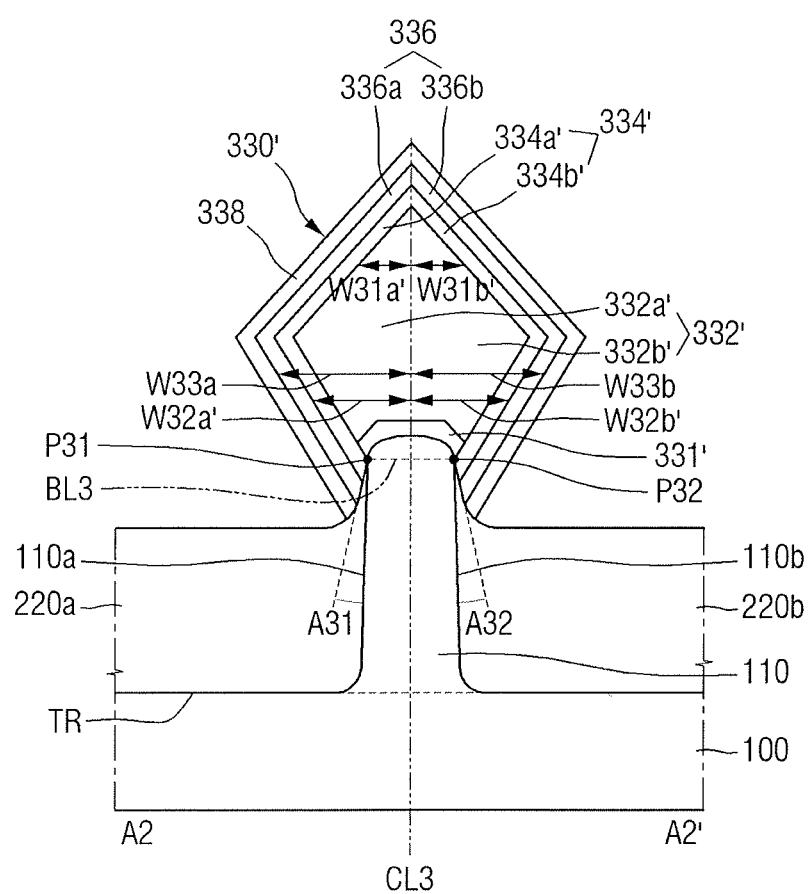
FIG. 9 is a cross-sectional view of a semiconductor device according to some exemplary embodiments.

FIG. 9 is a cross-sectional view of a semiconductor device according to some exemplary embodiments.

Referring to FIG. 9, the semiconductor device according to the exemplary embodiment of FIG. 9 includes an epitaxial pattern 330'. The epitaxial pattern 330' includes a first epitaxial layer 332', a second epitaxial layer 334', a third epitaxial layer 336, and a capping epitaxial layer 338.

The first epitaxial layer 332' may correspond to the first epitaxial layer 132 of FIG. 3. That is, the first epitaxial layer 332' may be symmetrical with respect to a fin central line CL3. Specifically, a first width W31a' of a first portion 332a' may be substantially the same as a second width W31b' of a second portion 332b'.

The second epitaxial layer 334' may be formed on the first epitaxial layer 332'. In some exemplary embodiments, the second epitaxial layer 334' may be symmetrical with respect to the fin central line CL3. Specifically, a third width W32a' of a third portion 334a' may be substantially the same as a fourth width W32b' of a fourth portion 334b'.

The third epitaxial layer 336 may be formed on the second epitaxial layer 334'. In some exemplary embodiments, the third epitaxial layer 336 may be symmetrical with respect to the fin central line CL3. Specifically, the third epitaxial layer 336 may include fifth and sixth portions 336a and 336b, which are disposed on opposite sides of the fin central line CL3. A fifth width W33a of the fifth portion 336a may be substantially the same as a sixth width W33b of the sixth portion 336b.

The capping epitaxial layer 338 may correspond to the capping epitaxial layer 138 of FIG. 4. That is, the capping epitaxial layer 338 may be formed to cover a seed epitaxial layer 331', the first epitaxial layer 332', the second epitaxial layer 334', and the third epitaxial layer 336.

Figure 10:
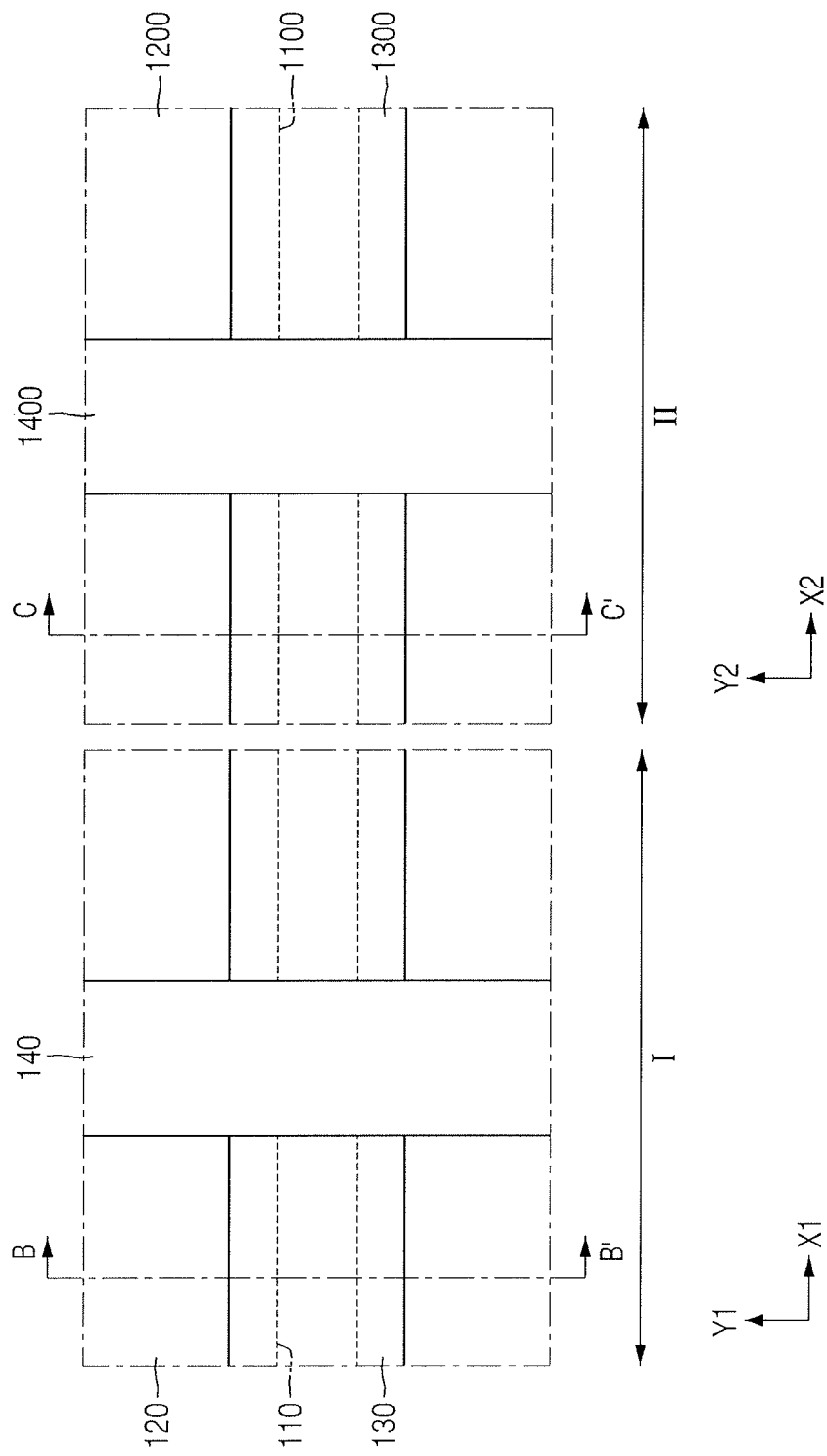
FIG. 10 is a plan view of a semiconductor device according to some exemplary embodiments.
Figure 11:
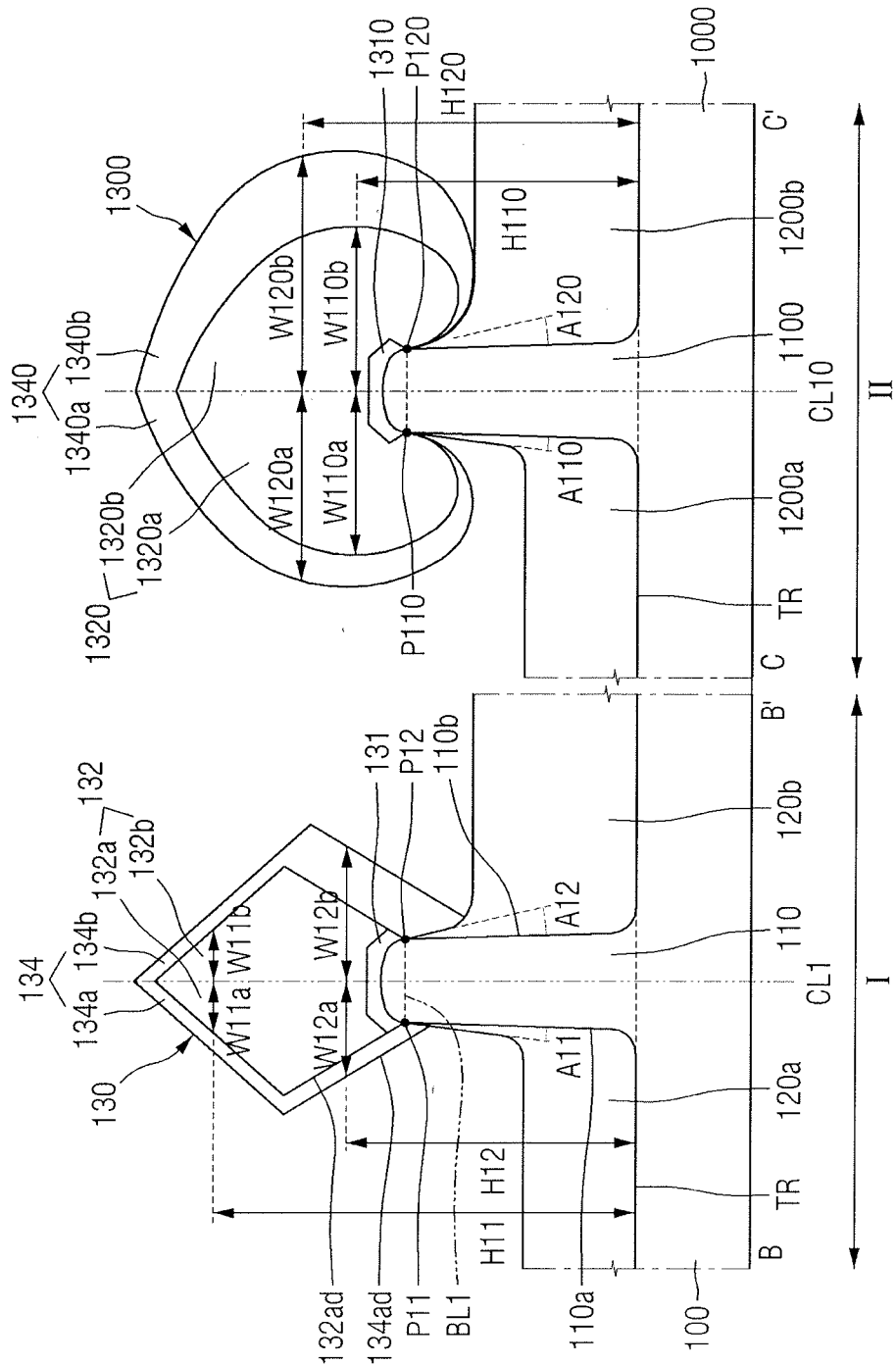
FIG. 11 shows cross-sectional views taken along lines B-B' and C-C' of FIG. 10.

FIG. 10 is a plan view of a semiconductor device according to some exemplary embodiments. FIG. 11 shows cross-sectional views taken along lines B-B' and C-C' of FIG. 10. For convenience, descriptions of elements that have already been described above with reference to FIGS. 1 through 3 will be omitted.

Referring to FIGS. 10 and 11, a first region I and a second region II are provided.

The first and second regions I and II may include semiconductor devices of different conductivity types. For example, the first region I may include a PMOS transistor, and the second region II may include an NMOS transistor.

The semiconductor device of the first region I may be substantially the same as the semiconductor device of FIGS. 1 through 3, and thus, a detailed description thereof will be omitted.

The semiconductor device of the second region II includes a substrate 1000, a fin-type pattern 1100, a first field insulating film 1200a, a second field insulating film 1200b, a gate electrode 1500, a gate insulating film 1400, and an epitaxial pattern 1300.

The top surface of the first field insulating film 1200a may form a first angle A110 with a first sidewall of the fin-type pattern 1100. The top surface of the second field insulating film 1200b may form a second angle A120 with a second sidewall of the fin-type pattern 1100. In some exemplary embodiments, the second angle A120 may be greater than the first angle A110.

The epitaxial pattern 1300 may include a seed epitaxial layer 1310, a first epitaxial layer 1320, and a second epitaxial layer 1340.

The seed epitaxial layer 1310 of the second region II may be substantially the same as a seed epitaxial layer 131 of the first region I.

The first epitaxial layer 1320 may be symmetrical with respect to a fin central line CL10. Specifically, the first epitaxial layer 1320 may include first and second portions 1320a and 1320b, which are disposed on opposite sides of the fin central line CL10. At an arbitrary first height H110, a first width W110a of the first portion 1320a may be substantially the same as a second width W110b of the second portion 1320b.

In some exemplary embodiments, the exterior of the first epitaxial layer 1320 may be rounded. For example, the exterior of the first portion 1320a may extend downwardly from a first point P110 and may extend in a curved shape over to the fin-type pattern 1100. Similarly, the exterior of the second portion 1320b may extend downwardly from a second point P120 and may extend in a curved shape over to the fin-type pattern 1100.

The second epitaxial layer 1340 may be asymmetrical with respect to the fin central line CL10. Specifically, the second epitaxial layer 1340 may include third and fourth portions 1340a and 1340b, which are disposed on opposite sides of the fin central line CL10. At a particular second height H120, a third width W120a of the third portion 1340a may be substantially the same as a fourth width W120b of the fourth portion 1340b.

In some exemplary embodiments, the exterior of the second epitaxial layer 1340, like the exterior of the first epitaxial layer 1320, may be rounded.

Figure 12:
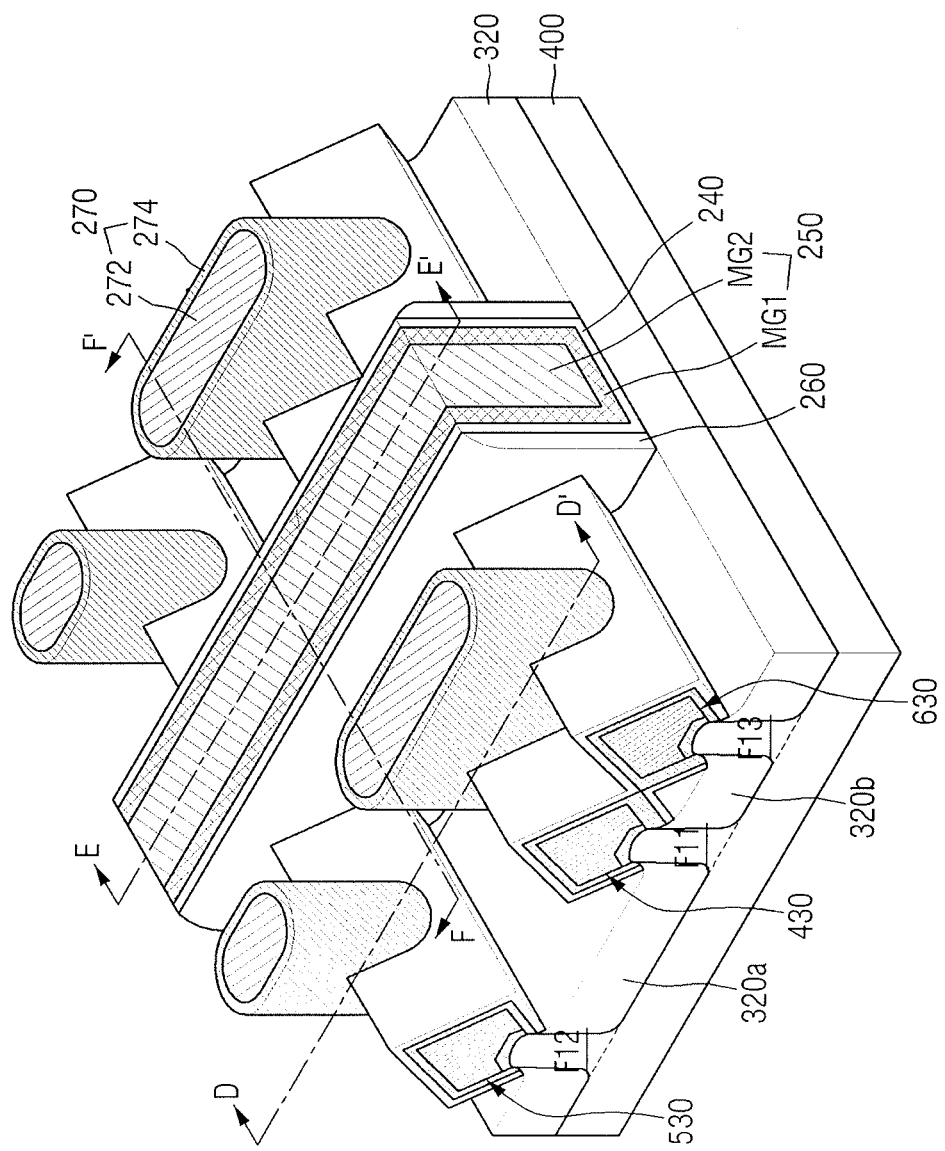
FIG. 12 is a perspective view of a semiconductor device according to some exemplary embodiments.
Figure 13:
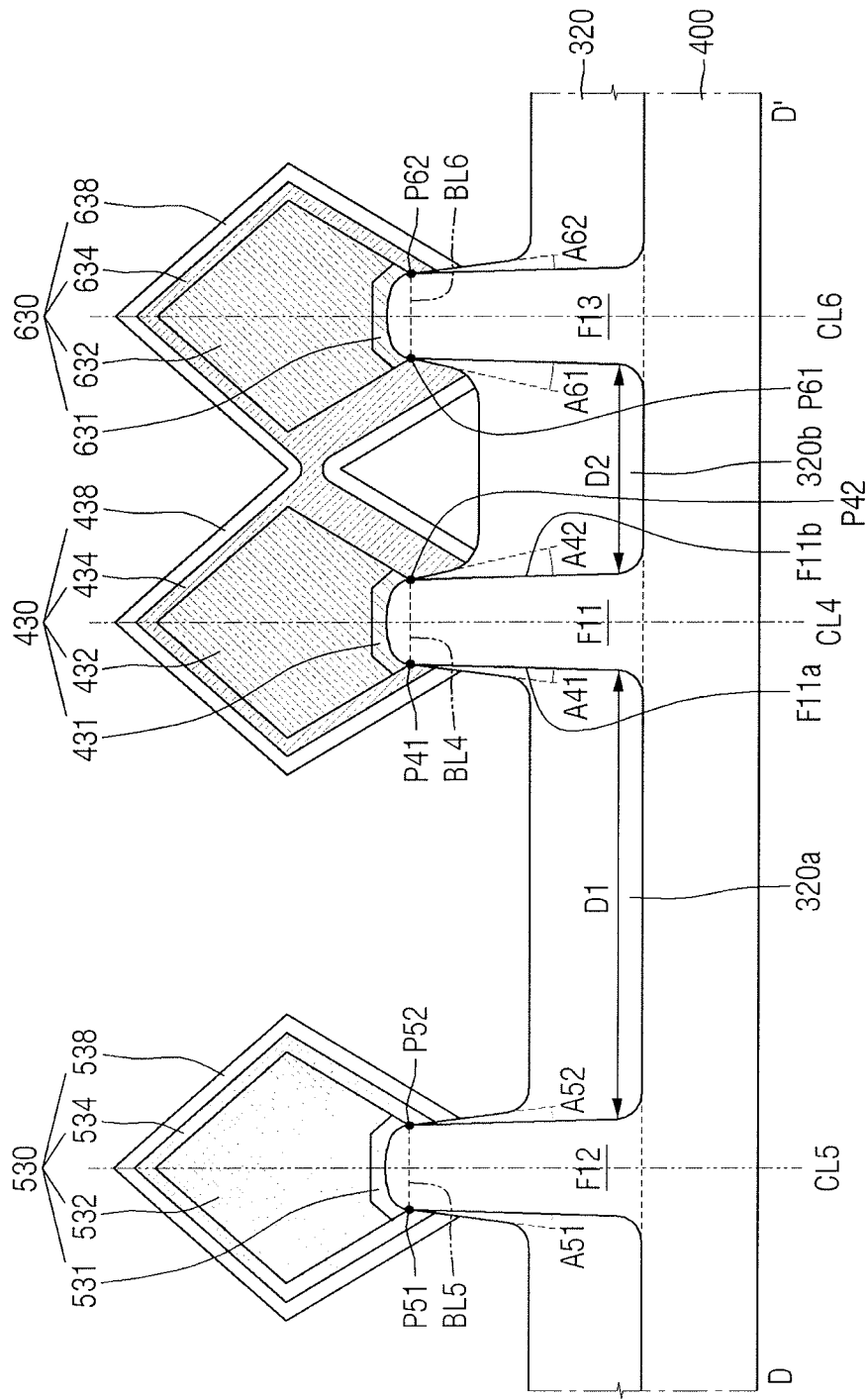
FIG. 13 is a cross-sectional view taken along line D-D' of FIG. 12.
Figure 14:
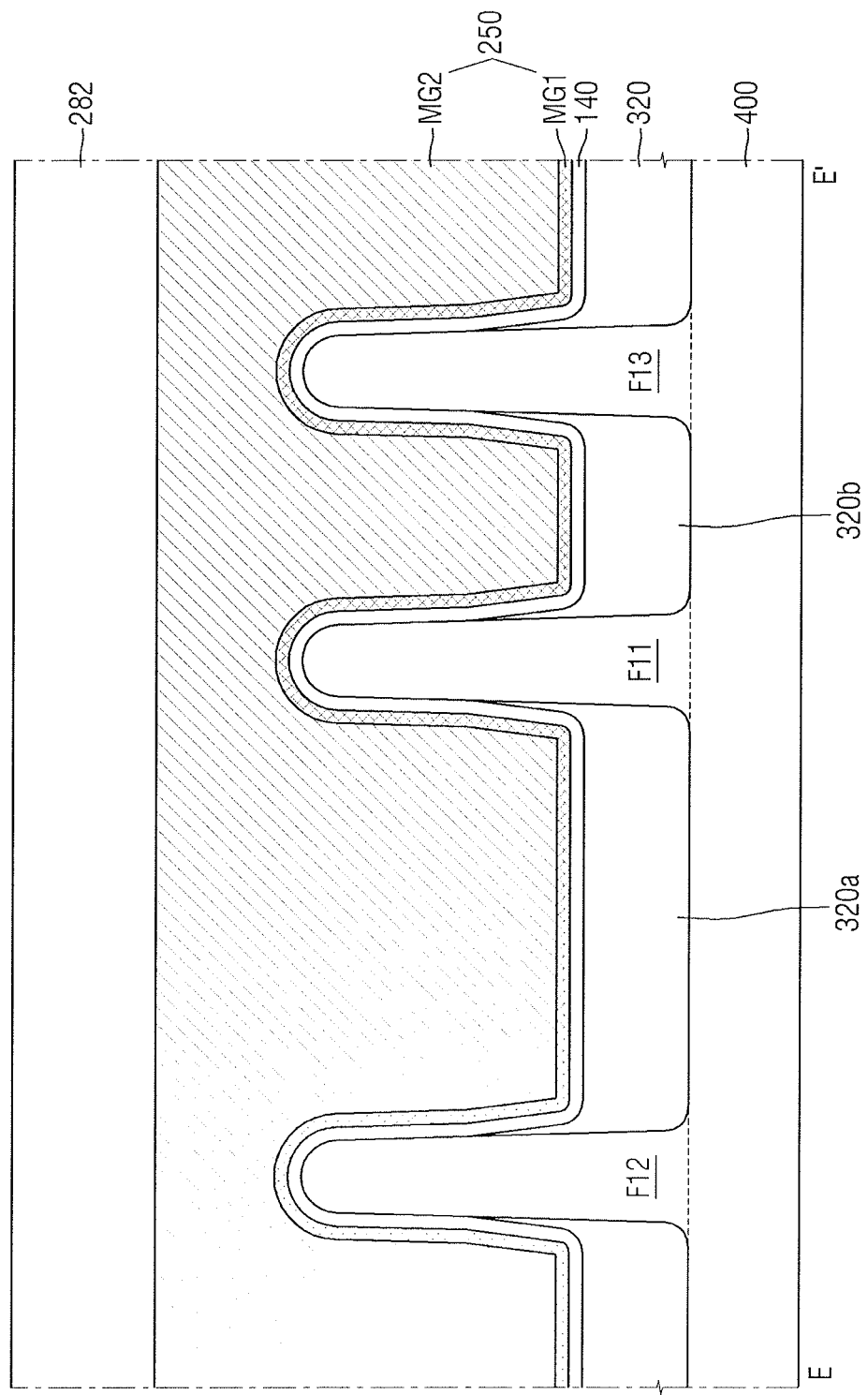
FIG. 14 is a cross-sectional view taken along line E-E' of FIG. 12.
Figure 15:
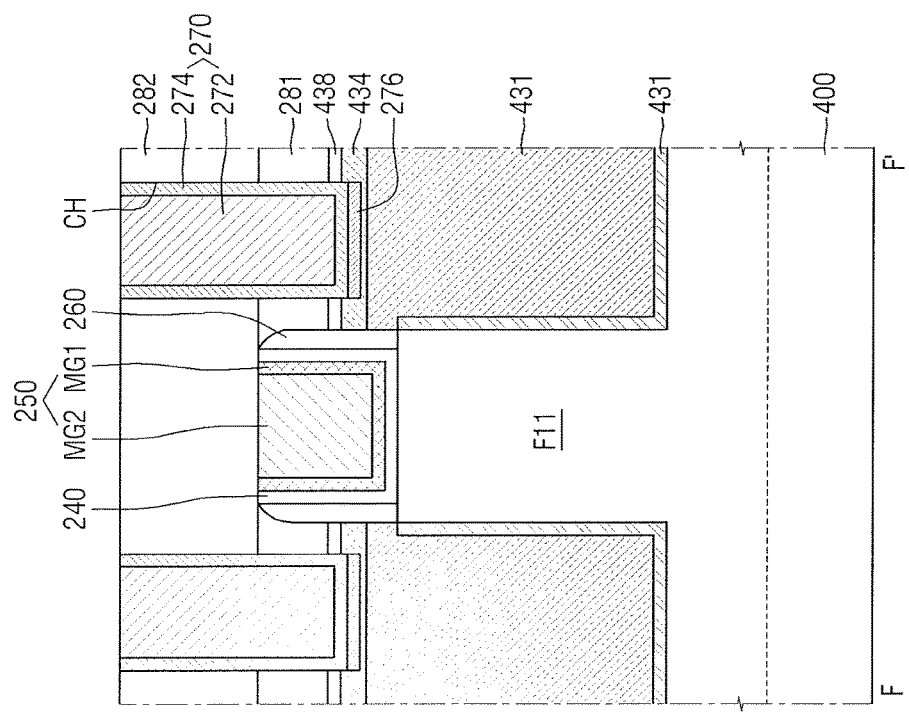
FIG. 15 is a cross-sectional view taken along line F-F' of FIG. 12.

FIG. 12 is a perspective view of a semiconductor device according to some exemplary embodiments. FIG. 13 is a cross-sectional view taken along line D-D' of FIG. 12. FIG. 14 is a cross-sectional view taken along line E-E' of FIG. 12. FIG. 15 is a cross-sectional view taken along line F-F' of FIG. 12. For convenience, descriptions of elements that have already been described above with reference to FIGS. 1 through 3 will be omitted.

Referring to FIGS. 12 through 15, the semiconductor device according to the exemplary embodiment of FIGS. 12 through 15 includes a substrate 400, a first fin-type pattern F11, a second fin-type pattern F12, a third fin-type pattern F13, a field insulating film 320, a gate electrode 250, a gate insulating film 240, gate spacers 260, a first epitaxial pattern 430, a second epitaxial pattern 530, a third epitaxial pattern 630, and contacts 270.

The first, second, and third fin-type patterns F11, F12, and F13 may be spaced apart from one another and may extend in parallel to one another. Specifically, the second fin-type pattern F12 may extend on one side of the first fin-type pattern F11, and the third fin-type pattern F13 may extend on the other side of the first fin-type pattern F11.

As illustrated in FIG. 13, the second fin-type pattern F12 may be a first distance D1 apart from a first sidewall F11a of the first fin-type pattern F11. The third fin-type pattern F13 may be a second distance D2 apart from a second sidewall F11b of the first fin-type pattern F11. In some exemplary embodiments, the second distance D2 may be smaller than the first distance D1.

The first field insulating film 320a may fill the gap between the first and second fin-type patterns F11 and F12. Accordingly, the top surface of the first field insulating film 320a may be placed in contact with the first sidewall F11a and may thus define a first point P41.

The second field insulating film 320b may fill the gap between the first and third fin-type patterns F11 and F13. Accordingly, the top surface of the second field insulating film 320b may be placed in contact with the second sidewall F11b and may thus define a second point P42.

Similarly, the top surface of the field insulating film 320 may be placed in contact with the second fin-type pattern F12 and may thus define third and fourth points P51 and P52. Specifically, the top surface of the first field insulating film 320a may be placed in contact with the second fin-type pattern F12 and may thus define the fourth point P52, and the third point P51 may be opposite to the fourth point P52. Also, the top surface of the second field insulating film 320b may be placed in contact with the third fin-type pattern F13 and may thus define fifth and sixth points P61 and P62. Specifically, the top surface of the second field insulating film 320b may be placed in contact with the third fin-type pattern F13 and may thus define the fifth point P61, and the sixth point P62 may be opposite to the fifth point P61.

At the first point P41, the first sidewall F11a and the top surface of the first field insulating film 320a may form a first angle A41. At the second point P42, the second sidewall F11b and the top surface of the second insulating film 320b may form a second angle A42. In some exemplary embodiments, the second angle A42 may be greater than the first angle A41 because the second distance D2 is smaller than the first distance D1. For example, during the etching of the field insulating film 320, the second field insulating film 320b, which is narrower than the first field insulating film 320a, may be less etched than the first field insulating film 320a. As a result, the top surface of the second field insulating film 320b at the second point P42 may have a gentler slope than the top surface of the first field insulating film 320a at the first point P41.

Similarly, the top surface of the second fin-type pattern F12 and the top surface of the first field insulating film 320a may form third and fourth angles A51 and A52 at the third and fourth points P51 and P52, respectively. Also, the top surface of the third fin-type pattern F13 and the top surface of the second field insulating film 320b may form fifth and sixth angles A61 and A62 at the fifth and sixth points P61 and P62, respectively. In some exemplary embodiments, the first and fourth angles A41 and A52 may be substantially the same, and the second and fifth angles A42 and A61 may be substantially the same.

The gate electrode 250 may include one or more metal layers. Specifically, the gate electrode 250 may include a stack of first and second metal layers MG1 and MG2. The first metal layer MG1 may control a work function, and the second metal layer MG2 may fill the space formed by the first metal layer MG1.

The gate spacers 260 may be formed on the sidewalls of the gate electrode 250. The gate spacers 260 are illustrated as having a single-layer structure, but the present disclosure is not limited thereto. That is, alternatively, the gate spacers 260 may have a multilayer structure.

The gate spacers 260 may include at least one of, for example, silicon nitride (SiN), silicon oxynitride (SiON), silicon oxide ($SiO_2$), silicon oxycarbonitride (SiOCN), and a combination thereof.

The first epitaxial pattern 430 may be formed on the first fin-type pattern F11 on both sides of the gate electrode 250. The first epitaxial pattern 430 may include a first seed epitaxial layer 431, a first epitaxial layer 432, a second epitaxial layer 434, and a first capping epitaxial layer 438.

The first epitaxial layer 432 may be symmetrical with respect to a first fin central line CL4. The second epitaxial layer 434 may be asymmetrical with respect to the first fin central line CL4. Accordingly, the first epitaxial pattern 430 may have an asymmetrical shape with respect to the first fin central line CL4.

The second epitaxial pattern 530 may be formed on the second fin-type pattern F12 on both sides of the gate electrode 250. The second epitaxial pattern 530 may include a second seed epitaxial layer 531, a third epitaxial layer 532, a fourth epitaxial layer 534, and a second capping epitaxial layer 538.

Each of the third and fourth epitaxial layers 532 and 534 may be symmetrical with respect to a second fin central line CL5. Accordingly, the second epitaxial pattern 530 may have a symmetrical shape with respect to the second fin central line CL5.

The third epitaxial pattern 630 may be formed on the third fin-type pattern F13 on both sides of the gate electrode 250. The third epitaxial pattern 630 may include a third seed epitaxial layer 631, a fifth epitaxial layer 632, a sixth epitaxial layer 634, and a third capping epitaxial layer 638.

The fifth epitaxial layer 632 may be symmetrical with respect to a third fin central line CL6. The sixth epitaxial layer 634 may be asymmetrical with respect to the third fin central line CL6. Accordingly, the third epitaxial pattern 630 may have an asymmetrical shape with respect to the third fin central line CL6.

In some exemplary embodiments, the second and sixth epitaxial layers 434 and 634 may be connected to each other, and the first and third capping epitaxial layers 438 and 628 may be connected to each other. However, the present disclosure is not limited to this.

Each of the contacts 270 may include a silicide film 276, a first conductive film 274, and a second conductive film 272. The contacts 270 may electrically connect the first, second, and third epitaxial patterns 430, 530, and 630 to wires.

The silicide film 276 may be formed at the bottom of each of the contacts 270 and may be placed in contact with the first, second, or third epitaxial pattern 430, 530, or 630. The silicide film 276 may include, for example, Pt, Ni, or Co, but the present disclosure is not limited thereto.

The first conductive film 274 may be conformally formed on the silicide film 276 and on the sidewalls and the bottom of each of contact holes CH. The second conductive film 272 may be formed to fill the contact holes CH.

The first conductive film 274 may include, but is not limited to, Ti or TiN, and the second conductive film 272 may include, but is not limited to, W, Al, or Cu.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device, comprising:
a fin-type pattern protruding from a substrate and including first and second sidewalls, which are defined by a trench;
a field insulating film in contact with the first and second sidewalls and filling the trench; and
an epitaxial pattern on the fin-type pattern and including a first epitaxial layer and a second epitaxial layer, the second epitaxial layer being on the first epitaxial layer,
wherein the first epitaxial layer includes a first concentration of a first material,
wherein the second epitaxial layer includes a second concentration of the first material,
wherein a first width of the second epitaxial layer on a first side of the fin-type pattern is larger than a second width of the second epitaxial layer on a second side of the fin-type pattern, the first and second widths being measured from a fin central line along a horizontal direction parallel to a bottom surface of the trench, and the fin central line crossing a center of the fin-type pattern along a vertical direction perpendicular to the bottom surface of the trench, and
wherein a first overlap region, where the second epitaxial layer directly contacts an outer surface of the field insulating film on the first side of the fin-type pattern, is larger than a second overlap region, where the second epitaxial layer directly contacts an outer surface of the field insulating film on the second side of the fin-type pattern.

2. The semiconductor device as claimed in claim 1, wherein:
the fin central line passes through a center of a fin boundary line connecting a first point, at which a top surface of the field insulating film and the first sidewall meet, and a second point, at which the top surface of the field insulating film and the second sidewall meet,
the second epitaxial layer includes first and second portions, which are on opposite sides of the fin central line,
at a first height with respect to the bottom surface of the trench, a width of the first portion is smaller than a width of the second portion, and
the first epitaxial layer includes third and fourth portions, which are on opposite sides of the fin central line, and
at the first height, a width of the third portion is the same as a width of the fourth portion.

3. The semiconductor device as claimed in claim 2, wherein:
the first portion includes a first upper inclined surface and a first lower inclined surface,
the second portion includes a second upper inclined surface and a second lower inclined surface,
the first upper inclined surface is parallel to the second lower inclined surface, the first width being measured from the fin central line to the second lower inclined surface, and
the first lower inclined surface is parallel to the second upper inclined surface.

4. The semiconductor device as claimed in claim 3, wherein the first upper inclined surface, the first lower inclined surface, the second upper inclined surface, and the second lower inclined surface have a [111] crystal plane.

5. The semiconductor device as claimed in claim 2, wherein the first portion includes a first upper inclined surface and a first lower inclined surface, at least part of an exterior of the second portion being rounded.

6. The semiconductor device as claimed in claim 5, wherein the width of the first portion is smaller than the width of the rounded part of the second portion.

7. The semiconductor device as claimed in claim 6, wherein the second portion includes a second upper inclined surface and a second lower inclined surface, only the second lower inclined surface in the second portion being rounded and having a larger width.

8. The semiconductor device as claimed in claim 7, wherein the first upper inclined surface, the first lower inclined surface, and the second upper inclined surface have a [111] crystal plane.

9. The semiconductor device as claimed in claim 2, wherein:
the epitaxial pattern further includes a third epitaxial layer, which is between the first and second epitaxial layers,
the third epitaxial layer includes fifth and sixth portions, which are on opposite sides of the fin central line, and
at a second height with respect to the bottom surface of the trench, a width of the fifth portion is the same as a width of the sixth portion.

10. The semiconductor device as claimed in claim 2, wherein:
the epitaxial pattern further includes a third epitaxial layer, which is between the first and second epitaxial layers,
the third epitaxial layer includes fifth and sixth portions, which are on opposite sides of the fin central line,
at a first height with respect to the bottom surface of the trench, a width of the first portion is smaller than a width of the second portion, and
at a second height with respect to the bottom surface of the trench, a width of the fifth portion is smaller than a width of the sixth portion.

11. The semiconductor device as claimed in claim 1, wherein the second concentration is different from the first concentration.

12. A semiconductor device, comprising:
a first fin-type pattern on a substrate and including first and second sidewalls, which are defined by a trench;
a second fin-type pattern at a first distance apart from the first sidewall;
a third fin-type pattern at a second distance apart from the second sidewall, the second distance being smaller than the first distance;
a first field insulating film in contact with the first sidewall and filling a gap between the first and second fin-type patterns;
a second field insulating film in contact with the second sidewall and filling a gap between the first and third fin-type patterns; and
a first epitaxial pattern on the first fin-type pattern,
wherein the first epitaxial pattern has a fin central line, which is perpendicular to a bottom surface of the trench,
wherein the fin central line passes through a center of a fin boundary line connecting a first point, at which a top surface of the first field insulating film and the first sidewall meet, and a second point, at which a top surface of the second field insulating film and the second sidewall meet, and wherein a width of the first epitaxial pattern from the fin central line on the second sidewall of the first fin-type pattern is larger than a width of the first epitaxial pattern from the central line on the first sidewall of the first fin-type pattern, and wherein a first angle, which is an acute angle between the first sidewall and the top surface of the first field insulating film, is smaller than a second angle, which is an acute angle between the second sidewall and the top surface of the second field insulating film.

13. The semiconductor device as claimed in claim 12, wherein a-height of a flat portion of the top surface of the first field insulating film is smaller than a height of a flat portion of the top surface of the second field insulating film relative to the bottom surface of the trench.

14. The semiconductor device as claimed in claim 13, wherein a direct contact area between the top surface of the first field insulating film and the first epitaxial pattern is smaller than a direct contact area between the top surface of the second field insulating film and the first epitaxial pattern.

15. The semiconductor device as claimed in claim 12, wherein:
the first epitaxial pattern includes a first epitaxial layer, which is on the first fin-type pattern, and a second epitaxial layer, which is on the first epitaxial layer,
the second epitaxial layer includes first and second portions, which are on opposite sides of the fin central line, and
at a first height with respect to the bottom surface of the trench, a width of the first portion is different from a width of the second portion, and widths of the first epitaxial layer on the opposite sides of the fin central line are equal to each other.

16. The semiconductor device as claimed in claim 12, wherein:
the first epitaxial pattern includes a first epitaxial layer, which is on the first fin-type pattern, and a second epitaxial layer, which is on the first epitaxial layer,
the second epitaxial layer includes first and second portions, which are on opposite sides of the fin central line, and
at least part of an exterior of the second portion is rounded.

* * * * *